United States Patent [19]
Morrill

[11] Patent Number: 6,137,379
[45] Date of Patent: Oct. 24, 2000

[54] UNIVERSAL NOISE CONTROLLER

[76] Inventor: Russell C. Morrill, 17354 Sunburst St., Northridge, Calif. 91325

[21] Appl. No.: 08/717,578

[22] Filed: Sep. 23, 1996

[51] Int. Cl.$^7$ .................................................... H03H 7/00
[52] U.S. Cl. ......................... 333/169; 333/170; 333/181; 333/177
[58] Field of Search .................................. 333/170, 171, 333/172, 177, 178, 174, 169, 181; 445/218, 220, 222, 194.1, 212, 213

[56] References Cited

U.S. PATENT DOCUMENTS

| | | | |
|---|---|---|---|
| 1,924,486 | 8/1933 | Crouse | 333/178 |
| 2,110,817 | 3/1938 | Penn | 333/169 |
| 2,397,772 | 4/1946 | Badmaieff | 333/169 |
| 3,263,191 | 7/1966 | Arvonio | 333/178 X |
| 3,375,446 | 3/1968 | Guyton | 455/220 |
| 4,600,903 | 7/1986 | Temer | 333/177 |
| 5,202,656 | 4/1993 | Clark et al. | 333/174 |
| 5,227,745 | 7/1993 | Oda et al. | 333/177 |

OTHER PUBLICATIONS

Matsch, "Electromagnetic and Electromechanical Machines", 2nd ed., Harper & Row Publishers, New York, NY, pp. 116–117, 1977.

*Primary Examiner*—Justin P. Bettendorf
*Attorney, Agent, or Firm*—Russell C. Morrill

[57] ABSTRACT

A universal noise controller is constructed of two windings on a magnetic core with a potentiometer connected across the windings. The input is connected in parallel to the windings and the potentiometer and the output is taken from a node in the center of the windings and a wiper arm of the potentiometer. This arrangement allows a phase change of 360 degrees by overlaying another signal thus providing phase cancellation from positive 180 degrees to negative 180 degrees thereby providing suitable noise cancellation based on the position of the wiper arm.

12 Claims, 6 Drawing Sheets

TOROID (T-1)

*Diagrams are not to scale

UNIVERSAL NOISE CONTROLLER

BACKGROUND OF INVENTION

This invention relates to noise and interference in radios, electronic communication devices and telephones. These items can only have noise reduction circuits placed in the interior of the radio, etc. Doing this disturbs the internal wiring and in some instances detunes the internal circuits and leaves a large part of the internal noise generating circuits free to continue to generate noise. The ideal solution would be to have such noise reduction and interference rejection circuitry placed outside the radio and control all the noise at the earphone or speaker connections and contribute no noise or interfering signals on its own and not require a power supply for operation.

This invention meets all of these requirements, not installed inside the radio or other audio equipment, and does not contribute noise or interference while removing noise and interference and uses well known electronic parts available from any electronic parts store to accomplish this noise reduction, elimination. The first working model of this invention was completed May 22, 1996.

None of the parts are invented by me to make this noise controller work. The invention is made possible by combining these well-known and readily available parts connected in a manner that I have never seen in the twenty odd years of searching for a circuit that would do the very things I have outlined above.

Description of Prior Art

Transmission line transformers utilize ferrite transformer core materials to achieve a wide-band pass transformer to cover various sections of the electromagnetic spectrum, such as the audio frequency range. It is possible to construct a circuit using transmission line type transformers with two distinct circuits using one transformer and one variable resistor without using the same common return or ground.

Figure 1:
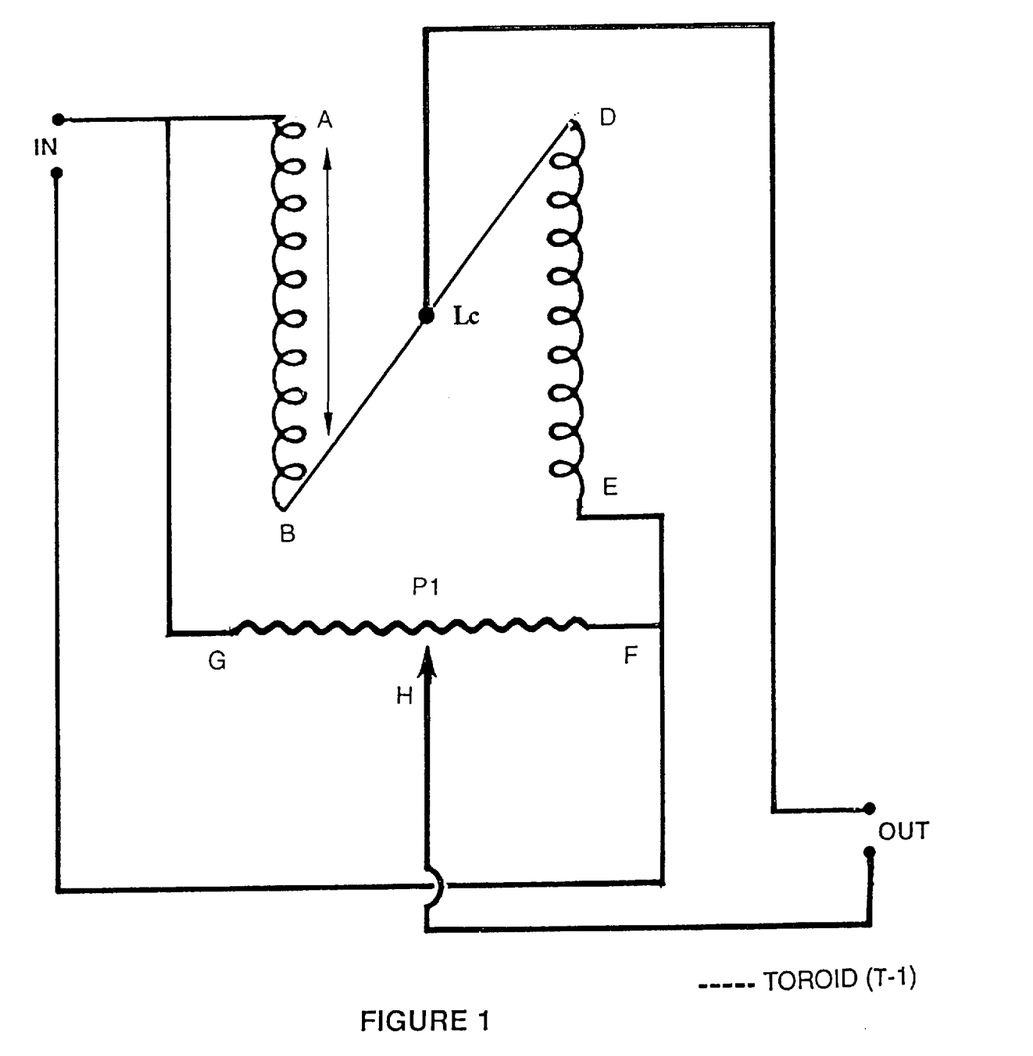
FIG. 1 shows a complete schematic of the Noise Controller.

An examination of FIG. 1 shows the circuit developed by me. This was the basis of the search for comparable art. If any connection of these windings and the variable resistance other than shown here are made the circuit does not work at all. Therefore, comparable art has to be exactly as shown and none has been found. If such art exists, it is a closely held secret and not available in publications.

An article in the proceedings of the IRE written in the 1950's pertaining to wide band baluns using ferrite and powdered iron cores with side-by-side winding or bi-filar, twisted pair of wires for wide band matching transformers between co-axial cable and center fed antenas providing a balanced feed system and eliminating the skew from unbalanced termination of coaxial cable was read frequently to understand the implications of this technology.

The detailed discussion of ferrite cores doped with several minerals having magnetic properties at high frequencies (rf) and the close coupling of two windings using the bi-filar method of creating balanced windings was to be the solution to winding two wires of the same length on the ferrite toroid and having a balanced set of windings that did not require the addition of or the removal of wire to achieve an electrical phase balance.

In addition to the discussion of the unique property of ferrite cores to maintain all the phase angles at any point on or in the core and that the flux was contained close to the core, this article ultimately held the key to having a common signal return or ground separate from the input common or ground. Therefore since none of the invention requires the inventing of any or all parts of the physical device, only the connection of the toroid and variable resistor is new and to my best knowlege does not exist outside of my mind and such disclosures as have been made to secure a patent. There is no comparable Art.

The assembly of the parts, all well-known electronic parts, in themselves do not constitute the basis of the patent, it is the connections made between these parts and the toroid and variable resistance (see FIG. 1.) The phase reversal of the two windings into independant circuits in a manner not done, to my knowledge, by anyone. The toroid and variable resistance as wired constitutes the basis for a patent. The application has been included to illustrate the method of achieving the noise control and suppression of interference.

Additional proof of no prior art is this—in operation the signal is divided into positive and negative phase angles. The separation occurs at point Lc (FIG. 1) also known as the reversal point which occurs between the two windings which are connected at the 180 degree point on a sine wave. This point becomes a common return for the output circuit. Connected across the input side of the transformer is a variable resistor, in the form of a wire wound potentiometer. The wiper arm becomes the signal side of the output circuit. A load placed between the wiper arm and the phase center tap Lc is now the output with the common ground at 180 degrees from each side of the two coils on the transformer. An out of phase signal corresponding to the phase of each winding makes it possible to have 180 + or − on each side of the output common.

Being able to invert each side of the transformer phase angles of 180 degrees + or 180 degrees − allow cancellation to take advantage of the Upper sideband (+) and the Lower sideband (−).

The 180 degree complete cancellation point occurs at the approximate center position of the variable resistor and is marked by complete silence.

Commercial cancellation systems in use today are based upon an all or nothing 180 degree out of phase signal being overlaid on the signal and the only variation being the use of a volume control to control the amount of cancellation based on amplitude control rather than variable phase control. The other method used is to have two microphones placed in earphones to pick up local noise, electronically phase them for 180 degree opposition with a fixed degree of cancellation and fixed or adjustable volume and fed back to the earphones as well as to a telephone. (I have purchased a set of the above method of canceling noise and found it did not have much effect beyond five hundred cycles). This item has been removed from their current catalog.

Recognized methods of removing noise are: Fm modulation, digital processing, various filters, compandering, pulse coded processing and variations of these methods, all suffering from the same problem. In the above noise reduction methods they fail as the signal strength fades below the threshold level where limiting begins.

My invention continues working until there is no signal decernable above the noise or in the noise. This is so because of the lateral movement of the canceling wave form.

Therefore, there is no applicable art except that art relative to the parts themselves but not to my method of connecting the parts to make the whole operate as stated above.

The Objects and Advantages.

My invention takes controlling noise and interference to a level where signals can be recovered when barely audible without contributing noise of its own and without the need for a d.c. power supply.

Another object and advantage of my invention provides an adjustable method of lateral phase cancellation noise control in electronic communications. The advantage lies in the ability to use this design to remove noise or interference from any signal provided it relates to a 360 degree phase angle as decoded by the receiver. Other advantages are:

a. only two major components and two minor componets are required.

b. no direct voltage or current is needed to power the equipment of my invention.

c. no common ground buss is used, input signal and output signal have their own.

d. control of phase angle is continous from zero to 360 degrees.

e. changing one or both components the device is usable form one cycle to the upper limits of signals in electronic communications.

f. if a coherent waveform exists it can be rescued from high incoherent noise levels.

g. signal loss in a reflected signal is less than 0.25 dB (signal reflected back to source.)

h. my invention has been reduced to practice, undergone testing and is ready to manufacture.

i. every old radio whether tube, transistor, crystal set as well a near obsolete electronic communications equipment will have, with my device, low or no noise and be useful again.

j. most beneficial will be the elimination of ear numbing noise.

Further Objects and Advantages: eliminating the need for a power supply extends the usefulness of the device to applications where an additional power sources would preclude its use in a portable application.

The universal noise controller is neither input or output dependent on a commn ground with the device it is connected to.

The method of cancellation is continously variable with lateral cancellation from 0 to 360 degrees. Current devices are all or nothing.

The low weight (about 10 ounces) provides true portability.

Rural areas will find my device indispensable in telephonic and radio communications.

A safety point—the unit can be hooked up backwards and still provide communications.

The noise elimination will not be as complete but communications will pass through.

BRIEF DESCRIPTION OF THE DRAWINGS

All drawings are numbered consecutively for clarity. All figures pertain to the invention.

FIG. 9 shows the printed circuit board with components mounted on it.

Reference numbers of drawing of T-1 and P-1
1. top of L1
2. bottom of L1
3. Lc reversal point between bottom of L1 andt top of L2
4. top of L2
5. bottom of L2
6. negative end of P1
7. positive end of P1
8. wiper arm
9. input
10. input
11. output
12. output
13. T1
14. P1

DESCRIPTION OF THE INVENTION

FIG. 1. is a complete schematic of the universal noise controller. Simple in concept, this design provides a powerful method of signal modification with respect to eliminating noise and interference. T-1 is a toroidial transformer core and is composed of ferrite materials with one or more modifying elements to provide the necessary band width and low core loss. One additional feature of the ferrite material plus additives is that the magnetic flux does not go beyond the immediate area of the core which results in concentrated magnetic flux and low core loss. These attributes provide the basis of reversing of part the signal through cross connection of the two inductances with minimum signal loss. L2 is 180 degrees negative in relation to L1. Lc is then the center tap of L1 and L2. This becomes the common return for the output signal.

Point Lc is the point that logicly has both positive and negative sines at the same time. The core composition, close containment of the magnetic flux, and the reverse connection of L1 and L2 establish the common point Lc, as one leg of the output section of the device. This leg is fixed at the 180 degree reference point Lc, as part of the cancellation process. Creating two signal commons is the method used to keep the input signal from contaminating the output signal and maintaining the designed pass-band angle of cancellation. An additional benefit of this arrangement is the method of obtaining greater precision in matching the two 180 degree points of the signal. This provides an energy sink for the low average power noise.

Figure 2:
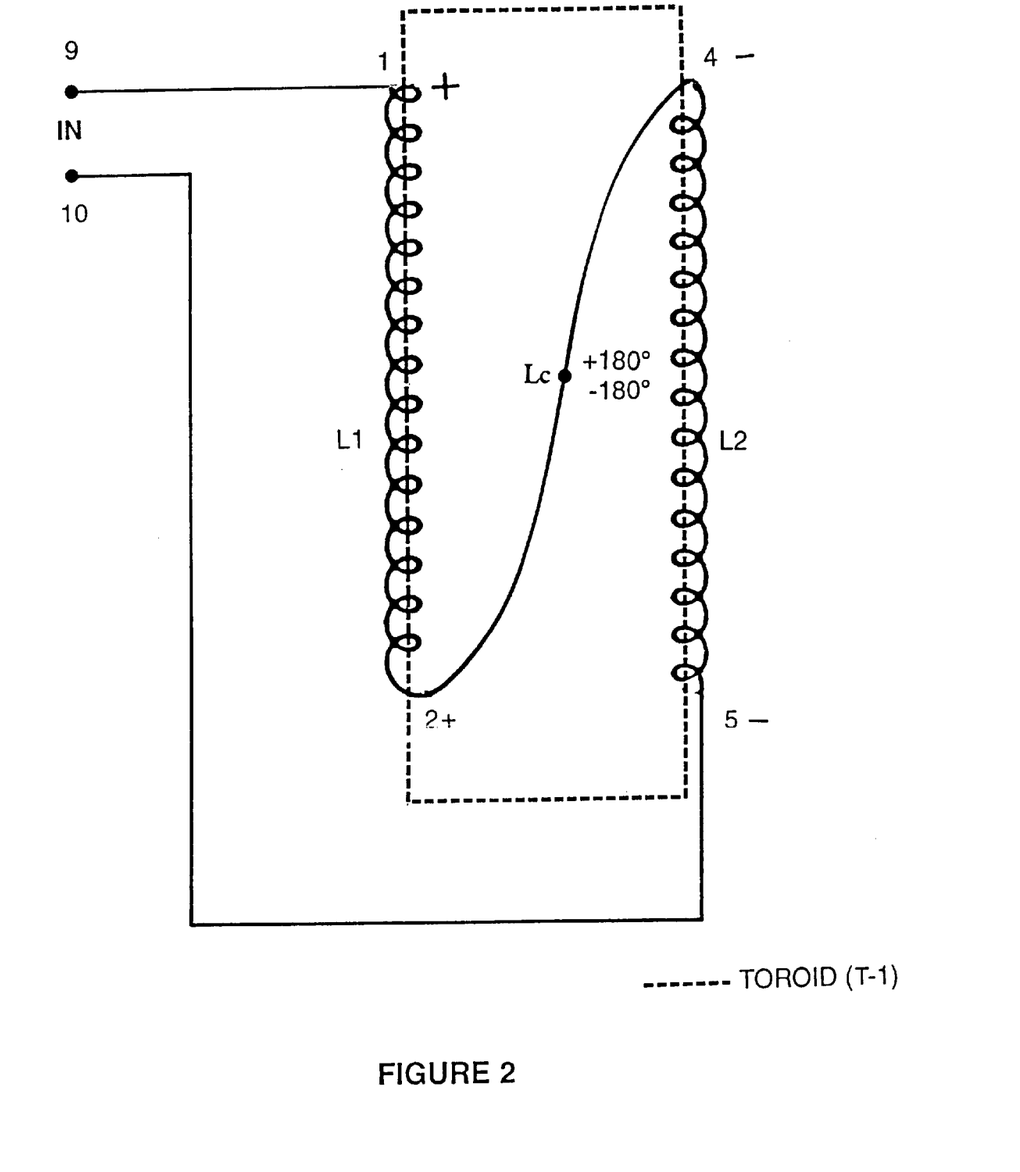
FIG. 2 shows a schematic of the input circuit.
Figure 3:
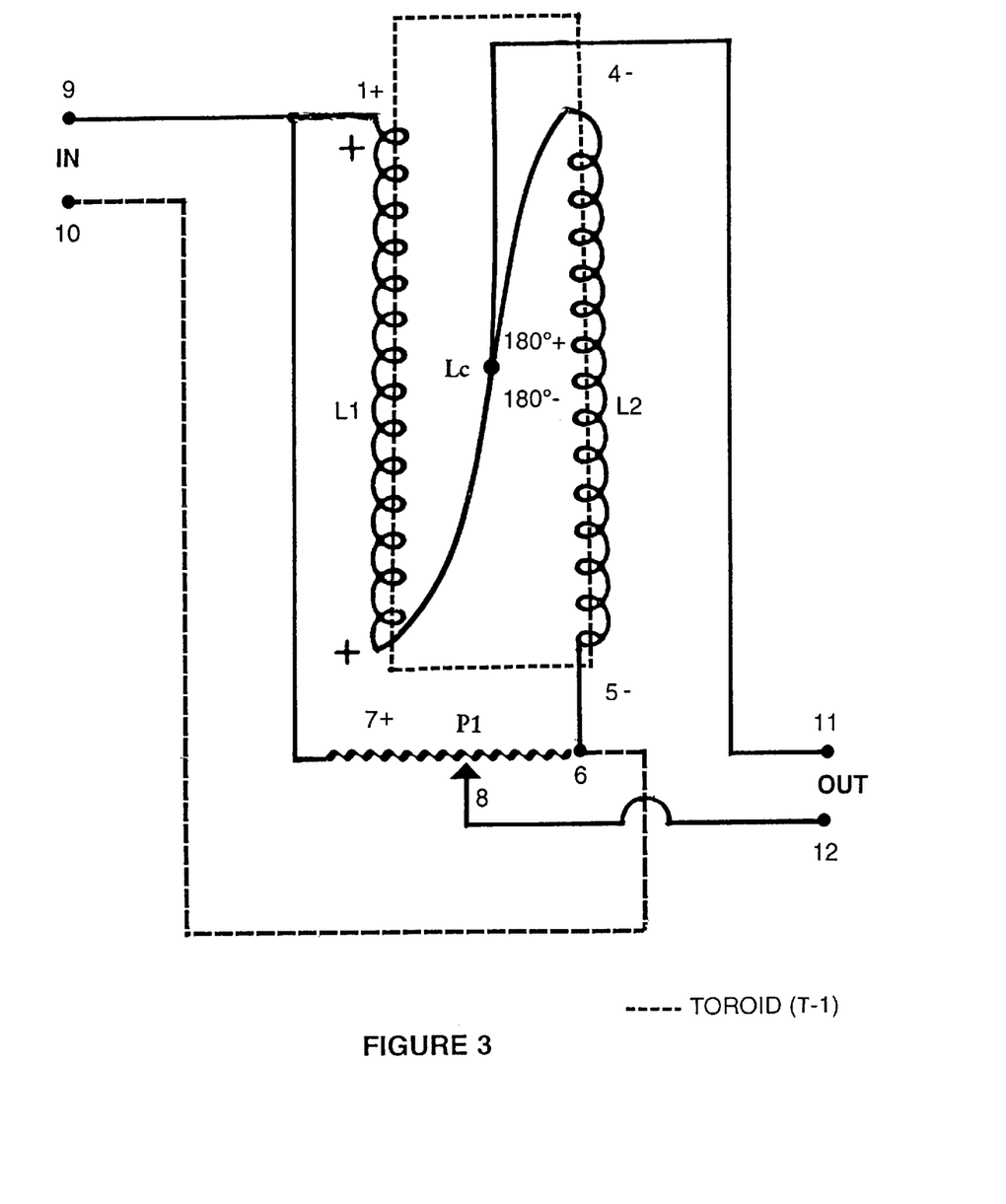
FIG. 3 shows a schematic of the output circuit.

FIG. 2, this illustrates the input circuit in FIG. 1, and the method used for establishing two sets of signals 180 degrees out of phase. The input signal appears across points 1 and points 5 of L1 and L2; An examination of the transformer shows a series connected device and the toroid transformer as used here maintains two voltages of the same amplitude but different phase relations. To accomplish this feat of having two identical voltages 180 degrees apart in polarity is one key to the design. The design of the windings placement on the toroid, is bi-filar instead of two independent windings. This maintains very close balance between the two windings even to measureing the tails of the windings to insure overall balance in the bi-filar winding. If this is not done, the cancellation point in the variable resistor will vary from unit to unit. The reversal connection Lc between L1 and L2 results in a combined pig tail and the wires at that point are measured and connected to preserve the balanced nature of the bi-filar windings FIG. 3 shows the output section. Variable resistor P1 is connected from the top of L1 to the bottom of L2. Wiper arm point 8 forms one leg of the output, and Lc. Variable resistor P1 is connected across the input points 1 and 5 and provides the method of obtaining the 360 degrees necessary to select the cancellation angle needed for noise reduction.

The wiper arm point 8 as its function is the selection of the phase angle referenced to point Lc at 180 degrees plus or minus. If the selection is from the side P1 is connected to, point 1 the cancellation angle is plus relative to point Lc. If the cancellation angle is chosen from the side of P2 connected to point 5, the cancellation angle is negative relative to point Lc. The method of obtaining an uncorrected signal is when the variable resistor P1 point 8 is at either end of P1,—points 6 or point 7.

Figure 5:
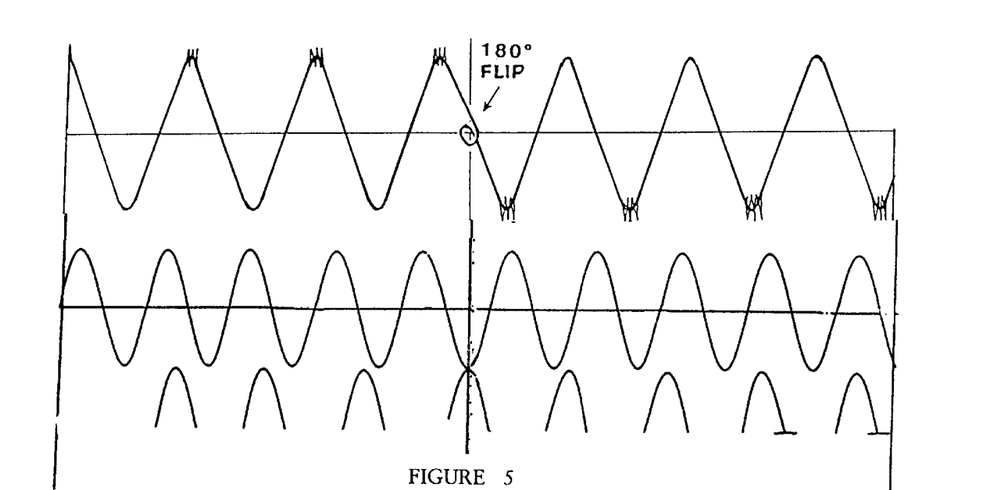
FIG. 5 shows method of cancellation used. Complete cancellation occurs when point 6 and point 8 are overlaid.

When the arm is at Lc the 180 degree point total cancellation is in effect (see FIG. 5). This feature can be used as a switch cutting off audio without disturbing the reciever settings—a bonus squelch control. The input common is at point 1 and point 5 the output common is Lc and point 8. The method of accomplishment is the inductances L1 and L2 which isolate point Lc from both input and output. Point Lc then becomes the logical output common and maintains isolation with points 1 and 5. The isolation prevents feed back from L2 to L1 maintaining a 360 degree electrical phase angle. This is more understandable when we enter one solution to this diagram. The material used in makeing a toroid utilizes doped ferrite blended for a uniform volume of these materials.

Creating a homogeneus mass provides a method for simultaneous positive and negative sines in any part of the core at any time. This method provides the basis of wide passband frequencies and closely contained flux permitting the flow of signals in either diretion instead of restricting them.

Figure 4:
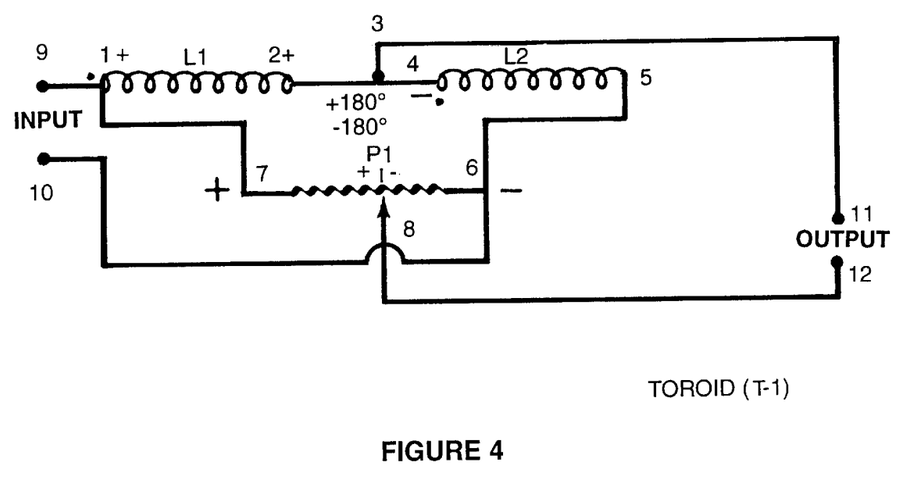
FIG. 4 shows polarity change in relation to point Lc.
Figure 6:
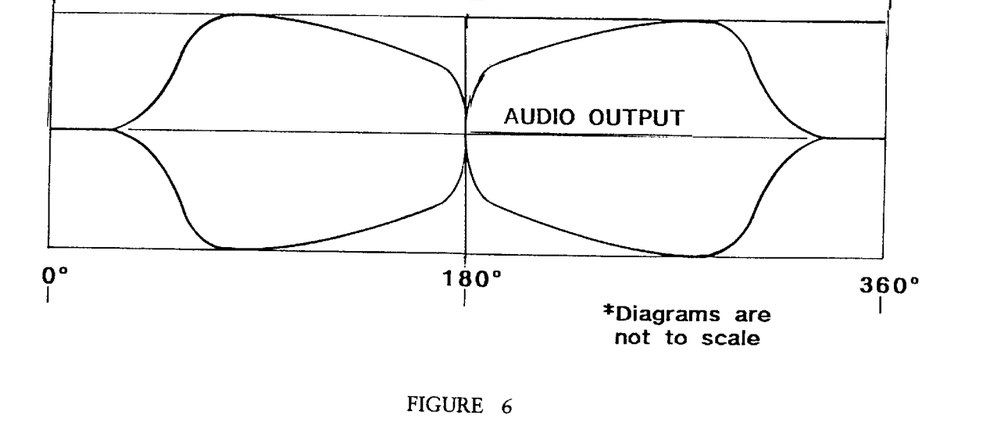
FIG. 6 shows complete cancellation.

FIG. 4 shows how the phase reversal switches from plus to minus and back. At the top of the figure the sinewaves shown have two actions that can be traced by using a "marker" on the positive side on the left, as the 180 degree swicting point is crossed, the positive sineway flips and becomes the negative sine wave. This action creates the swtich from positive to negative when in negative phase. The opposing signal flips also to continue the 180 degree cancellation action (see FIG. 6).

Figure 7:
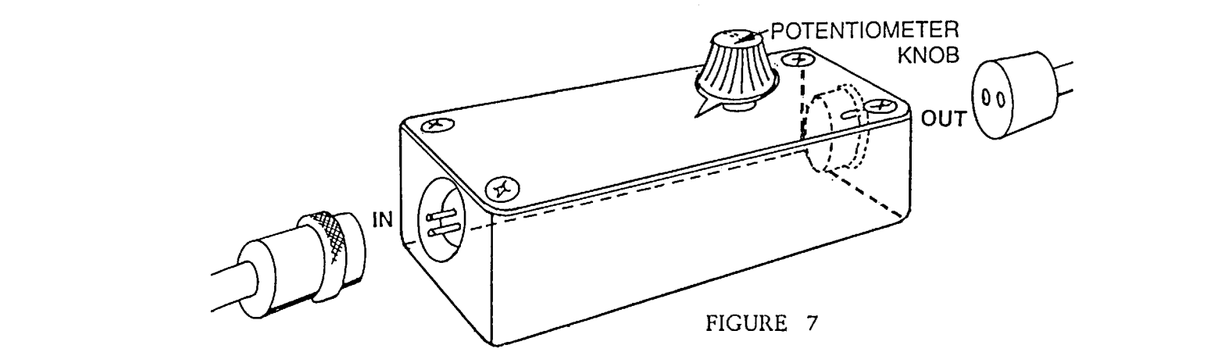
FIG. 7 shows mechanical layout of the noise controller container.

FIG. 7. shows placement of the input and output connectors and shows the printed circuit board edgewise and the parts mounted in relaive positions for a box configuration.

Figure 8:
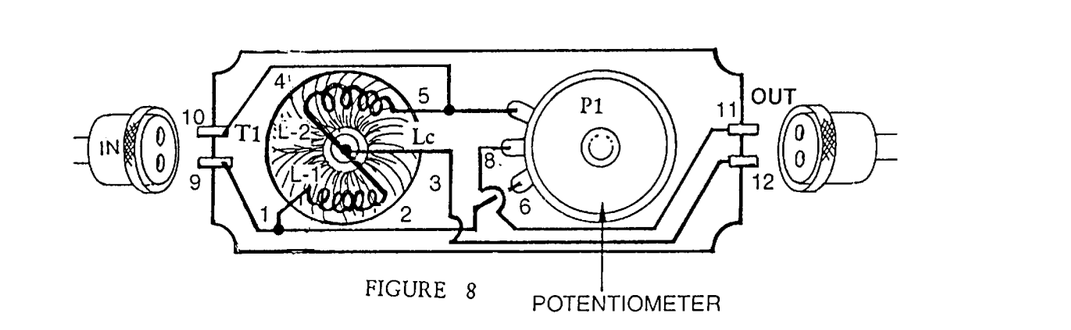
FIG. 8 shows the printed circuit board layout.
Figure 8A:
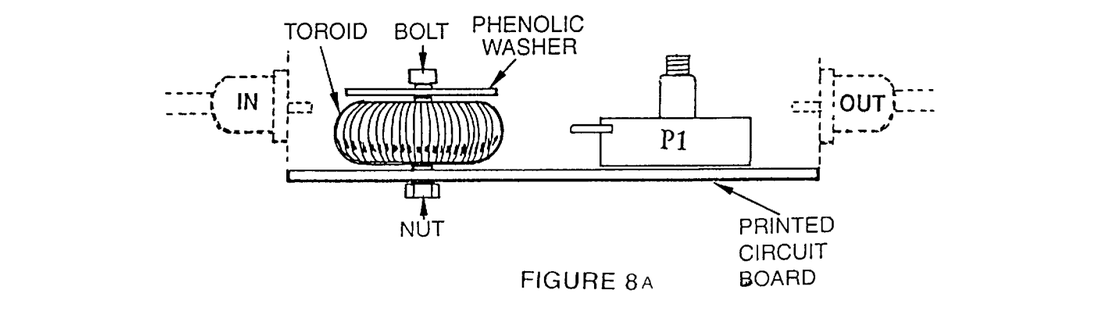

FIG. 8 shows the control knob on the top cover used to adjust the degree of cancellation. All of these parts and pieces are obtained from local electronic parts stores and I make no claim or suggestion that this invention includes them as being invented by me, phraseology used to describe the actions and functions are likewise well known in the Electronic field. The two cables are attached to, a device that requires monitoring and a speaker, or earphone, input to a telephone or fax machine or other electornic communications or data receiving equipment. The noise controller provides a method of reducing or eliminating noise and provide a clean signal. In actual operation, the noise condition would be determined in advance of use. Adjustment made to get a quiet signal. The adjustments are to the receiver or receiving device gain control. Telephones for instance have a fixed maximum volume. The low loss of the device does not change the audiobility of the signal being supplied to the noise controller output at the user end. All tone controls, boost or cut circuits have to be initially set to mid range before adjustment of the noise controller is made.

The simplest test is conducted with earphones plugged into the output of the noise controller and monitoring the signal to determine if noise is present. If noise is present, then move the control on the noise controller until the noise just disappears. Note the position of the knob and turn to each side of the center mark. Note which cancels the noise or interference better with the least cancellation. Having made the adjustment, monitor the signal for a few mnutes or so then proceed. Once set for a location one does not have to go through this setup often. Noise locations, such as office buildings, homes, work places have a nearly constant type of noise so adjustments once made are good for long periods of time. Telephones are a special problem as they are all duplex operations, (talk and listen at the same time). A telephone's microphone allows the person using the telephone to hear themselves speak. It also transmits the ambient noise, that is, noise around the caller. This requires two units one for receiving and one unit for transmitting,. The transmitter's output is in the ear piece,—both have to be noise controlled. Of course, if the environment is quiet, only one unit per phone is necessary Fax machines need the noise controller on receive only. Noise beyond the audio source or in-house machinery is beyond the point of control on the ouput side. The conditions illustrated in the prior sentence shall not infer that they are the only conditions requiring noise suppression. Signal and noise are equal in strength. With the noise controller action, cancellation, the signal with the greater average power is recovered. Random noise has a lower average power and is absorbed into the cancellation earlier in the cancellation cycle. Random noise can gain average power if the amplification of the receiving device is set too high. It is conceivable that two or three nose cancellers in tandem might be needed if the ambient noise is tightly packed and of high amplitude. Standing to rear of a 747 in take off mode would, I think, be a bit much for a noise control device. An operational point: when close to an airport if the unit is used in aircraft, it would be wise to use as much cancellation as necessary to read the tower and then return the unit to a less restrictive amount of cancellation. The style of cancellation used is different from the usual cancellation method. Current methods resemble a punch press in that they squash the signal and noise down togther so that the noise is below the signal amplitude.

The noise controller system moves one half of the signal, negative, over the positive signal and since control is 180 degrees wide, it can overlap the positive signal to achieve cancellation. When moving the control to the negative side of the signal, an inversion occurs where the positive half and the negative half of the sine wave are reversed. (See FIG. 6). If this did not occur, cancellation would only occur on one side of the signal When both halves of the signal are exactly 180 degrees apart there is no output because cancellation is complete. Immediately upon passing through 180 degrees the audio signal is readable again.

Summary Ramifications and Scope

The ramifications of my invention are quite well defined. The unit is small, light weight, easily carried in a pocket or gadget bag, suit-case, etc. The unit uses a new method of cancellation. It is designated as variable lateral overlay and does not require a power supply of any sort. In portable operaton this means longer operation on a given barttery charge when using portable transceivers or radios. The noise controller controls the level of noise and interference by a circuit that uses lateral overlay cancellation instead of compression. The use of a ferrite toroidial transformer provides the method of creating and using two separate commons (i.e. grounds). This provides isolation in two forms. 1) the flux containment which provides the method of supporting opposite polarity signals with out loss of signal level. 2. Complete isolation of the input and output signals reduces contamination to a minimum.

Most importantly the noise controller reduces ear damage from loud sounds, repeative sounds, and prevents damage to amplitude sensitive equipment.

The scope of the unit's operation is quite large. The frequency range, for example, is from one hertz to the upper ranges of electronic circuits. The requirement within this range is the choice of toroidial core materials and the inductance,—no other modification of the basic circuit is necessary.

The unit does not require a power supply of any type or kind. This feature allows noise cancellation any where any time without shortening the battery charge of the portable radio. Noise is processed out of almost any signal, but processing the noise at the audio or signal output preferred.

Another use of the noise controller, is to remove the noise from other wise clean audio. A few degrees of cancellation will clean out the floor noise as well. Floor noise is the ambient noise in a radio, tape recorder, etc. The removal of floor noise reduces the stress the barely audible noise can supply. It was discovered while testing the unit that on AM stations a few degrees of cancellation left in place all the time improved the sound out of a simple radio as well as the more expensive ones. In aviation communications, there are specialized headsets to remove motor, rotor and propeller noises but rarely are they capable of reducing or eliminating cross modulation caused by adjacent channel spill over and intermodulation of one signal on top of another. Noise from atmospherics, space, lightning and the like can be removed. The noise controller can reduce the splatter of noise but it is very difficult to remove because the receiver itself is at fault. The universal noise controller can remove splatter, sometimes to the extent that both signals can be heard where before neither were understandable.

An area of exploration is visual communications among those that would benifit are: video and slow scan television defination. Slow scan television definitio would be improved to the point where images would not tear, break up because of noise. Ultra sound definition would be increased by reducing the noise that is tissue generated close to the transducer head. Since the amount of removal of that kind of noise is adjustable, only how much noise removal would be under the operators control. This would advance electronic imaging greatly.

SUMMARY

The outstanding features is that cancellation is achieved by variable lateral overlay. The adjustable signal moves in time laterally by plus 180 degrees and minus 180 degrees. The signal is cancelled from the base line. If a pulse and from the 0 signal level line of the sinewave. A reminder: sinewave base lines are an intersection of zero degrees, one hundred eighty degrees and three hundred sixty degrees of one cycle. There is no cancellation in effect except at the 180 degree mark where the change from positive first sinewave to negative first sinewave takes place (see drawing FIG. 6). No additional noise is added. No common bus is required, between the input and output (unit floats between source and audible or electronic output) with unlimited frequency coverage and signal power capabilities, the noise controller is adaptable to as yet many unknown uses.

The simple circuit, uses ferrite toroidial cores and acheives spectacular results with so little volume and weight which makes listening a pleasure.

One use alone would justify the granting of a patent. Reduction of ear damage because of accumulated damage caused by loud noise to the inner ear. The revival of old-out-dated radios and noisy electronic equipment is possible because the noise controller makes using them a pleasure again.

COMPONENT LIST AND CONSTRUCTION DIRECTIONS

COMPONENT LIST FOR A Universal Noise Controller.

A pass-band of 50 to 1500 cycles at 0.25 db reflected loss is currently the test bed. The lower frequency, 50 cycles was chosen as a barrier to low frequecy noises.

1. Toroid T1 is a type 73 ferrite with the following dimensions, ½ inch inside diameter, ⅛ inch thick and ½ inch wide manufactured by Fair-Rite Products Corp. Toroid type 73 is a manganese-zinc ferrite core.
2. L1 and L2 are 40 mH each, modified scramble wound with ¹⁄₁₆th inch spacing at each end of each winding.

A separation of the two inductances is ¹⁄₁₆ inch at each end of the windings maintains the inductance balance. Scramble wound inductances reduce the distributed capacity of each winding a method of maintaining a wide frequency pass-band.

3. P1 a potentiometer is a wire resistance wound on a card and uses a wiping arm to select a resistance equal to the phase angle required for a degree of cancellation. The winding should have the capability of dissipating one watt of heat for a one watt signal ouput.
4. A BUD CU123 cast aluminum case with screw down lid is the container for the noise controller Two holes are drilled in the lid, one for the potentiometer shaft and a support bolt hole. The physical size of the box is a function of the diameter of the toroid plus winding. The box use is 3½" long 1½" wide and 1¼" deep. All measurements are in inches.
5. Two quarter inch connectors are used for input and output cables. Each has a cable clamp to take the strain off the connecting pins. Each connector has two pins in the current design. The connector shown is a cable only connector.

Two insulating washers to protect each side of the toroid transformer.

The inductance windings on T-1 have to have the same number of turns per coil, measure the same resistance, have the same inductance. Lead wires are trimmed to the same length and fastened to the component each wire is mated to. Do not coil the wires around a nail or a pencil, so as to make a shorter lead. Doing that will upset the balance between the two windings.

If the frequency range is increased from which noise is to be cancelled, the use of Bi-Filar windings will be easier to handle since both L1 and L2 are wound simultaneously. If this is done use different colored wires so that each wire can be identified.

This configuration is not recommended for RF use.

The printed circuit board is self explanatory. The wiring is simple, the connections are minimal and the support role is self evident. The wiring is correct but as shown is for point to point wiring. For a printed circuit board some leads will have to be rerouted.

What is claimed is:

1. A universal noise controller comprising:
    an assembly of two windings connected in series and wound around a magnetic core;
    a potentiometer connected in parallel with the two windings;
    input terminals connected in parallel with the potentiometer and the two windings;

output terminals one of which is connected at a node between the two windings and another is connected at a wiper arm of the potentiometer wherein a variable lateral noise cancellation is produced by a change in a position of the wiper arm.

2. The universal noise controller as claimed in claim 1, further including a circuit board for mounting the assembly and the potentiometer thereon.

3. The universal noise controller as claimed in claim 2, further including a metallic enclosure surrounding the circuit board.

4. The universal noise controller as claimed in claim 1, wherein the assembly of the two windings and the magnetic core provides a transformer.

5. The universal noise controller as claimed in claim 1, wherein the two windings have an equal number of turns.

6. The universal noise controller as claimed in claim 1, wherein the two windings have equal inductance values.

7. The universal noise controller as claimed in claim 6, wherein the value of each inductance is 40 mH.

8. The universal noise controller as claimed in claim 4, wherein the two windings on the core are wound as a bi-filar winding.

9. The universal noise controller as claimed in claim 1, wherein the magnetic core comprises manganese-zinc ferrite.

10. The universal noise controller as claimed in claim 1, wherein the potentiometer comprises a wire-wound resistor.

11. The universal noise controller as claimed in claim 10, wherein the wire-wound resistor is wound on a non-conducting card.

12. The universal noise controller as claimed in claim 1, wherein the magnetic core has a toroidal shape.

* * * * *